(12) United States Patent
Qi et al.

(10) Patent No.: US 12,406,884 B2
(45) Date of Patent: Sep. 2, 2025

(54) SELF FIELD-SUPPRESSION CVD TUNGSTEN (W) FILL ON PVD W LINER

(71) Applicant: Applied Materials, Inc., Santa Clara, CA (US)

(72) Inventors: Zhimin Qi, Fremont, CA (US); Yi Xu, San Jose, CA (US); Shirish A. Pethe, Cupertino, CA (US); Xingyao Gao, San Jose, CA (US); Shiyu Yue, San Jose, CA (US); Aixi Zhang, Sunnyvale, CA (US); Wei Lei, Campbell, CA (US); Yu Lei, Belmont, CA (US); Geraldine Vasquez, San Jose, CA (US); Dien-yeh Wu, San Jose, CA (US); Da He, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 422 days.

(21) Appl. No.: 17/718,242

(22) Filed: Apr. 11, 2022

(65) Prior Publication Data

US 2023/0326791 A1  Oct. 12, 2023

(51) Int. Cl.
*H01L 21/768* (2006.01)
*C23C 14/18* (2006.01)
(Continued)

(52) U.S. Cl.
CPC ........ *H01L 21/76879* (2013.01); *C23C 14/18* (2013.01); *C23C 16/14* (2013.01);
(Continued)

(58) Field of Classification Search
CPC ......... H01L 21/28562; H01L 21/76877; H01L 21/76843; H01L 21/28556; H01L 21/76846
See application file for complete search history.

(56) References Cited

U.S. PATENT DOCUMENTS

| | | | | |
|---|---|---|---|---|
| 6,037,263 A | * | 3/2000 | Chang ............... | H01L 21/28518 438/692 |
| 7,427,568 B2 | * | 9/2008 | Chen ..................... | C23C 16/045 438/785 |

(Continued)

FOREIGN PATENT DOCUMENTS

JP        03-179744 A      8/1991

OTHER PUBLICATIONS

International Search Report for PCT/US2022/036483, dated Dec. 13, 2022.

*Primary Examiner* — Tony Tran
(74) *Attorney, Agent, or Firm* — Moser Taboada

(57) ABSTRACT

Embodiments of methods and associated apparatus for filling a feature in a substrate are provided herein. In some embodiments, a method of depositing tungsten in features of a substrate includes: depositing a seed layer consisting essentially of tungsten in the features via a physical vapor deposition (PVD) process; and depositing a bulk layer consisting essentially of tungsten in the features via a chemical vapor deposition (CVD) process to fill the features such that the deposition of the bulk layer is selective to within the features as compared to a field region of the substrate, wherein the CVD process is performed by flowing hydrogen gas ($H_2$) at a first flow rate and a tungsten precursor at a second flow rate, and wherein the first flow rate is less than the second flow rate.

12 Claims, 4 Drawing Sheets

(51) Int. Cl.
*C23C 16/14* (2006.01)
*H01L 21/285* (2006.01)

(52) U.S. Cl.
CPC .... *H01L 21/2855* (2013.01); *H01L 21/28562* (2013.01); *H01L 21/28568* (2013.01)

(56) References Cited

U.S. PATENT DOCUMENTS

| | | |
|---|---|---|
| 9,378,976 B2 | 6/2016 | Shaviv |
| 11,075,115 B2 | 7/2021 | Chandrashekar et al. |
| 11,230,764 B2 | 1/2022 | Lehn et al. |
| 2009/0321943 A1 | 12/2009 | Meldrim et al. |
| 2014/0248767 A1 | 9/2014 | Bian |
| 2021/0043510 A1* | 2/2021 | Jiang ................ H01L 21/76877 |
| 2021/0358853 A1 | 11/2021 | Wang et al. |

* cited by examiner

SELF FIELD-SUPPRESSION CVD TUNGSTEN (W) FILL ON PVD W LINER

FIELD

Embodiments of the present disclosure generally relate to processing of substrates.

BACKGROUND

Integrated circuits are formed by processes that produce intricately patterned material layers on substrate surfaces. Tungsten is used in the semiconductor industry as a lower resistivity conductor with minimal electro-migration. Tungsten may be used to fill features as contacts for transistors and in the formation of vias between layers of integrated devices. Tungsten may also be used for interconnects in logic and memory devices due to tungsten's stability and low resistivity. However, conventional tungsten metal gap fill processes may be prone to voids during gap fill due to early pinch-off at overhangs.

Accordingly, the inventors have provided improved processes to facilitate void-free tungsten gap fill.

SUMMARY

Embodiments of methods and associated apparatus for filling a feature in a substrate are provided herein. In some embodiments, a method of depositing tungsten in features of a substrate includes: depositing a seed layer consisting essentially of tungsten in the features via a physical vapor deposition (PVD) process; and depositing a bulk layer consisting essentially of tungsten in the features via a chemical vapor deposition (CVD) process to fill the features such that the deposition of the bulk layer is selective to within the features as compared to a field region of the substrate, wherein the CVD process is performed by flowing hydrogen gas ($H_2$) at a first flow rate and a tungsten precursor at a second flow rate, and wherein the first flow rate is less than the second flow rate.

In some embodiments, a method of depositing tungsten in features of a substrate includes: depositing a seed layer consisting essentially of tungsten in the features via a physical vapor deposition (PVD) process; and depositing a bulk layer consisting essentially of tungsten in the features via a chemical vapor deposition (CVD) process to fill the features, wherein substantially all of the deposition of the bulk layer is in the features as compared to a field region of the substrate, and wherein the CVD process is performed by: flowing hydrogen gas ($H_2$) at a first flow rate of about 10 to about 500 sccm; flowing a tungsten precursor at a second flow rate of about 100 to about 1000 sccm, wherein the first flow rate is less than the second flow rate; and flowing argon gas at a third flow rate of about 3000 to about 7000 sccm.

In some embodiments, a computer readable medium having instructions store thereon that, when executed, cause a method of depositing tungsten in features of a substrate to be performed, the method includes: depositing a seed layer consisting essentially of tungsten in the features via a physical vapor deposition (PVD) process; and depositing a bulk layer consisting essentially of tungsten in the features via a chemical vapor deposition (CVD) process to fill the features such that the deposition of the bulk layer is selective to within the features as compared to a field region of the substrate, wherein the CVD process is performed by flowing hydrogen gas ($H_2$) at a first flow rate and a tungsten precursor at a second flow rate, and wherein the first flow rate is less than the second flow rate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
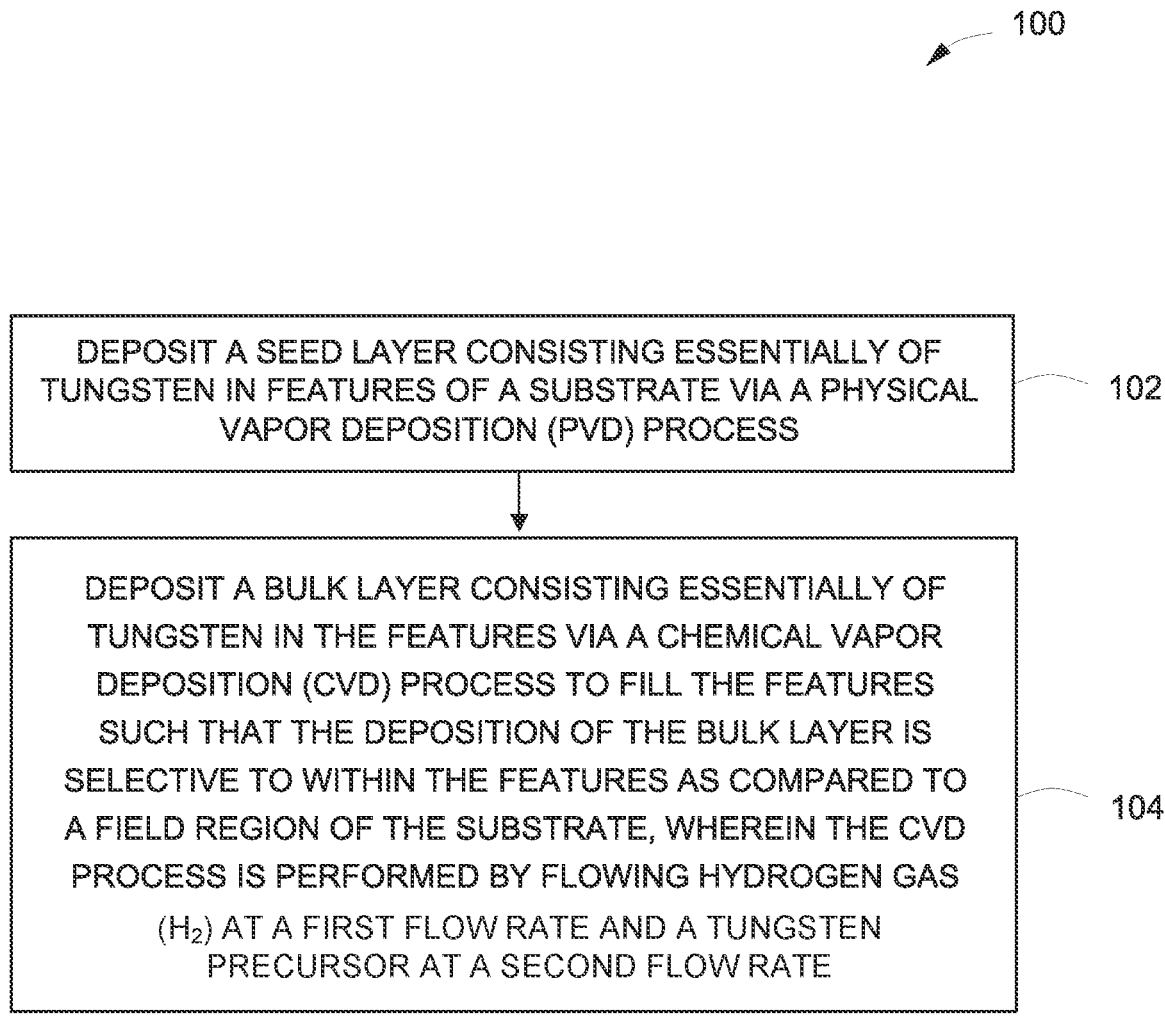
FIG. 1 depicts a flow chart of a method of filling a feature in a substrate in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus described herein provide void-free or substantially void-free tungsten gap fill in substrates. The embodiments provided herein may be used to fill features formed in substrates such as vias, trenches, or the like. Tungsten is widely used as metallic interconnect in logic and memory devices, because of tungsten's unique stability and low resistivity. However, along with technological advances and smaller feature sizes comes an increasing need for a metal fill solution with void-free or substantially void-free gap fill. The critical dimensions (CD) of the trenches or vias may be within a range of approximately 1 nm to approximately 1000 nm with aspect ratio (AR) of the features between about 1:1 and about 80:1.

The methods provided herein are directed at superconformal chemical vapor deposition (CVD) processes for performing bulk fills with deposition rates that increase with depth away from a front opening (or decrease with proximity to the front opening) of the features in the substrate. As such, continued CVD deposition in the features fills the features without or substantially without leaving voids or pockets of low-density materials. Superconformal CVD deposition typically includes two or more co-reactants, with partial pressures of the co-reactants chosen such that surface coverage of the more rapidly diffusing co-reactant is relatively small, and thus rate limiting, near a front opening of the feature. The deposition rate increases deeper into the feature because the pressure of the slowly diffusing co-reactant drops more rapidly with depth than the pressure of the more rapidly diffusing co-reactant, which increases the surface coverage of the fast-diffusing co-reactant and therefore increases growth rate. As such, under superconformal CVD deposition, deposition is selective to within the features as compared to a field region of the substrate, resulting in self-suppressed CVD deposition in the field and overhang regions.

Figure 2:
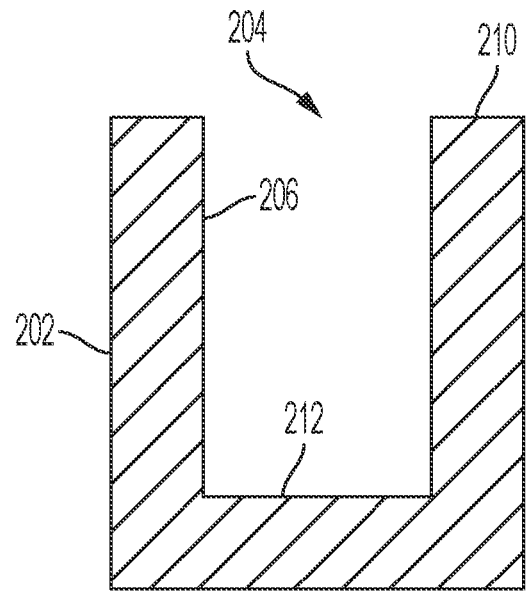
FIG. 2 depicts a cross-sectional view of a portion of a substrate having a feature in accordance with at least some embodiments of the present disclosure.

FIG. 1 depicts a flow chart of a method 100 of filling a feature in a substrate (e.g., substrate 202) in accordance with at least some embodiments of the present disclosure. FIG. 2 depicts a cross-sectional view of a portion of a substrate 202 having a feature 204 in accordance with at least some embodiments of the present disclosure. The feature 204 may be a via, a trench, or the like, formed in the substrate 202. The feature 204 may extend into the substrate 202 from a field region 210 or upper surface of the substrate 202. The feature 204 may include a bottom surface 212 and sidewalls 206 that extend from the bottom surface 212 to the field region 210.

Figure 3:
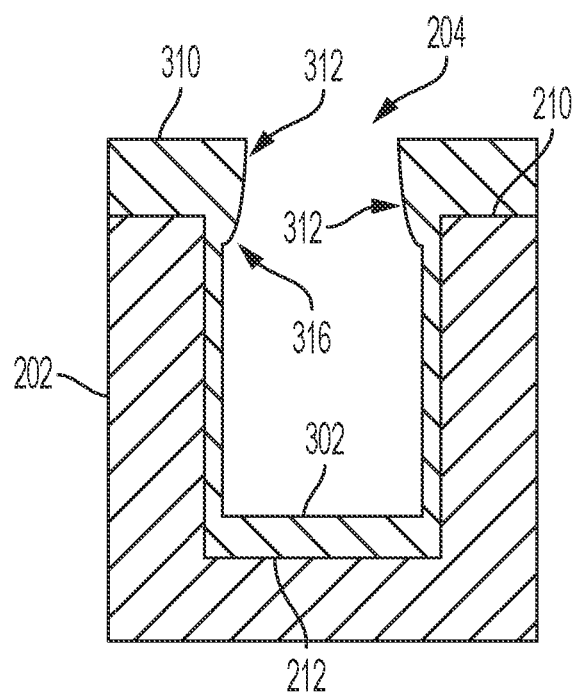
FIG. 3 depicts a cross-sectional view of a portion of a substrate having a seed layer deposited via a physical vapor deposition (PVD) process in a feature in accordance with at least some embodiments of the present disclosure.

The method 100 at 102 includes, as depicted in FIG. 3, depositing a seed layer (e.g., seed layer 302), or liner, consisting of or consisting essentially of tungsten in the features (e.g., features 204) via a physical vapor deposition (PVD) process. For example, the seed layer or liner can be essentially pure tungsten. In some embodiments, the seed layer 302 does not include nitrogen. In some embodiments, consisting essentially of tungsten is greater than or equal to 95 percent tungsten. In some embodiments, the PVD deposited seed layer comprises approximately 100% tungsten. In some embodiments, the PVD process is performed at a temperature of about 200 to about 500 degrees Celsius. In some embodiments, the PVD process is performed at a chamber pressure of about 0.1 to about 10 mTorr. The seed layer 302 generally covers the bottom surface 212 of the feature 204 as well as sidewalls 206 of the feature 204. The seed layer 302 may also be deposited on the field region 210 (e.g., field layer 310) of the substrate 202 and form overhang regions 312 proximate a front opening 316 of the features 204.

Figure 4:
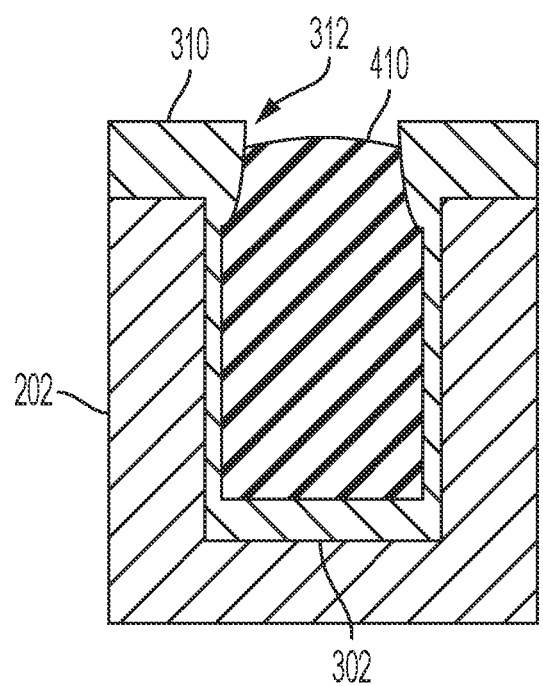
FIG. 4 depicts a cross-sectional view of a portion of a substrate after depositing a bulk fill on a seed layer via a chemical vapor deposition (CVD) process in accordance with at least some embodiments of the present disclosure.

The method at 104 includes depositing a bulk layer (e.g., bulk layer 410) consisting or consisting essentially of tungsten in the features via a chemical vapor deposition (CVD) process to fill the features, as depicted in FIG. 4. In some embodiments, consisting essentially of tungsten is greater than or equal to 95 percent tungsten. In some embodiments, a tungsten concentration in the bulk layer 410 is less than a tungsten concentration in the seed layer 302. For example, the seed layer 302 may have a 100% or approximately 100% tungsten concentration and the bulk layer 410 may have a 95% or greater tungsten concentration. The deposition of the bulk layer 410 is selective to within the features 204 as compared to the field region 210 of the substrate 202, resulting in self-suppressed CVD deposition in the field region 210. The self-suppressed CVD deposition provides minimal or substantially no deposition of the bulk layer 410 on the seed layer 302 in the field region 210 or overhang regions 312. Accordingly, the features 204 may advantageously be filled without pinch-off, avoiding or substantially avoiding voids or low-density bulk fill.

The CVD process is performed by flowing hydrogen gas ($H_2$) at a first flow rate and a tungsten precursor at a second flow rate into a CVD chamber. The tungsten precursor may be a tungsten halide. For example, in some embodiments, the tungsten precursor may have a chemical formula or $WM_x$, where M may be a halogen, for example, fluoride or chloride. In some embodiments, x may be 5 or 6. In some embodiments, the tungsten precursor is tungsten hexafluoride or tungsten pentachloride. In some embodiments, a partial pressure of the hydrogen gas ($H_2$) is about 0.2 Torr to about 1 Torr. In some embodiments, a partial pressure of the tungsten precursor is about 0.2 Torr to about 1 Torr. In some embodiments, the CVD process is performed at a temperature of about 200 to about 500 degrees Celsius. In some embodiments, the CVD process is performed at a chamber pressure of about 1 to about 300 Torr.

The first flow rate is generally less than the second flow rate. In some embodiments, the first flow rate of the hydrogen gas ($H_2$) is about 10 to about 500 sccm. In some embodiments, the first flow rate is about 10 to about 200 sccm. In some embodiments, the first flow rate is about 25 to about 75 sccm. In some embodiments, the second flow rate of the tungsten precursor is about 100 sccm to about 1000 sccm. In some embodiments, the second flow rate is about 300 to about 800 sccm. In some embodiments, the second flow rate is about 400 to about 600 sccm. In some embodiments, the second flow rate is about 8 to about 12 times greater than the first flow rate.

In some embodiments, the method 100 includes flowing an inert gas during the CVD process at a third flow rate of about 3000 sccm to about 7000 sccm. The inert gas may function as a carrier gas to aid in delivering the tungsten precursor into the CVD chamber as well as fine-tuning the CVD chamber pressure. In some embodiments, the inert gas is argon. In some embodiments, the third flow rate is about 4 to about 20 times greater than the second flow rate. In some embodiments, the third flow rate is about 15 to about 600 times greater than the first flow rate.

In some embodiments, the CVD process is advantageously performed after the PVD process without an intermediate passivation process. In some embodiments, the CVD process is advantageously performed after the PVD process without etching the overhang region 312 of the substrate.

Figure 5:
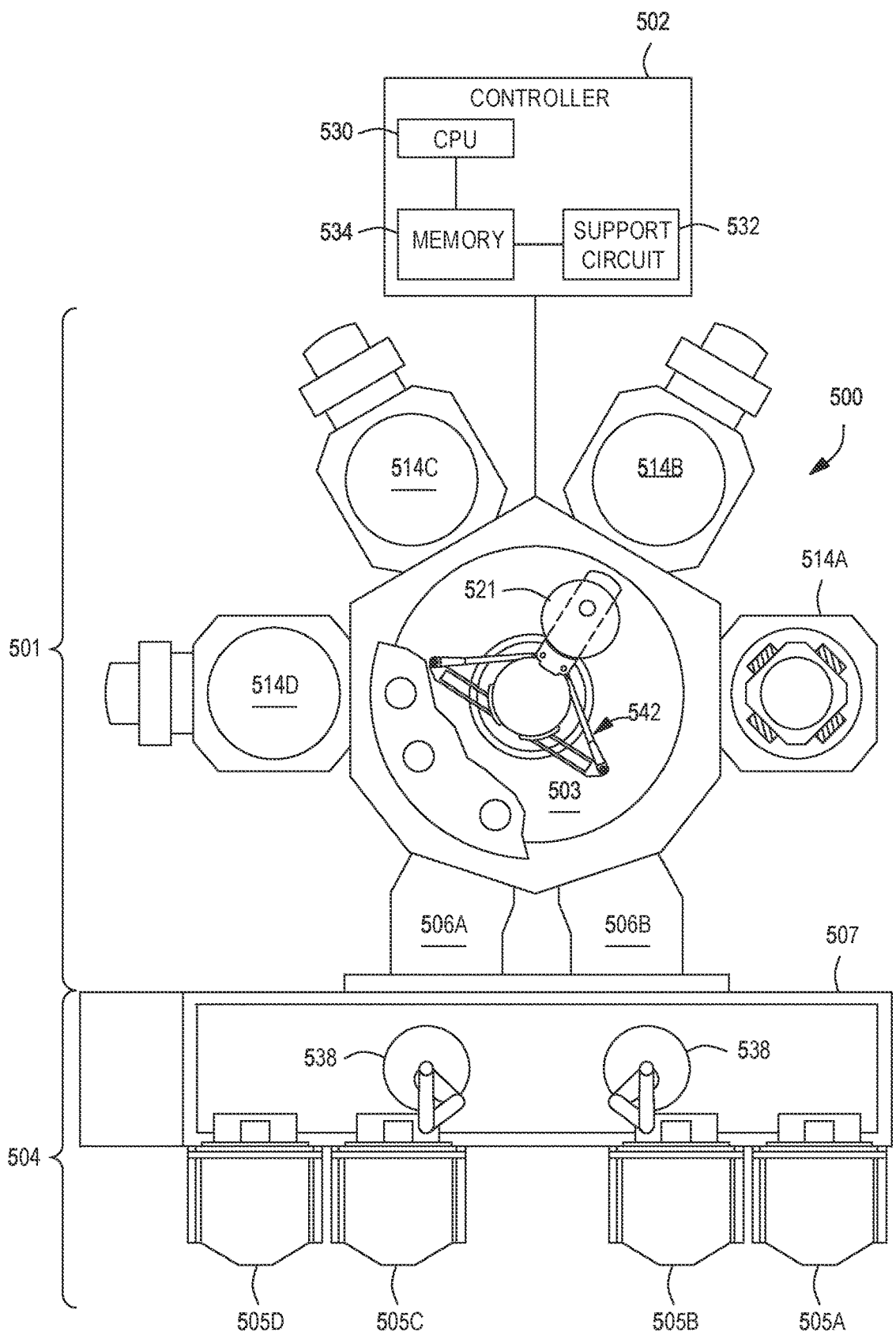
FIG. 5 depicts a multi-chamber processing tool in accordance with at least some embodiments of the present disclosure.

In some embodiments, the PVD process of 102 and the CVD process of 104 are performed in a common multi-chamber processing tool. For example, FIG. 5 depicts a multi-chamber processing tool 500 in accordance with at least some embodiments of the present disclosure. The multi-chamber processing tool 500 may be suitable to perform the methods of the present disclosure. The methods described herein may be practiced using other multi-chamber processing tools having suitable process chambers coupled thereto, or in other suitable process chambers. For example, in some embodiments, the inventive methods discussed above may be advantageously performed in a multi-chamber processing tool such that there are limited or no vacuum breaks between processing steps. For example, reduced vacuum breaks may limit or prevent contamination of any substrates being processed in the multi-chamber processing tool.

The multi-chamber processing tool 500 generally includes a processing platform 501 that is vacuum-tight, a factory interface (FI) 504, and a system controller 502. The processing platform 501 includes multiple processing chambers, such as 514A, 514B, 514C, and 514D, operatively coupled to a transfer chamber 503 that is under vacuum. The factory interface 504 is selectively operatively coupled to the transfer chamber 503 by one or more load lock chambers, such as 506A and 506B shown in FIG. 5.

In some embodiments, the factory interface 504 comprises at least one docking station 507 and at least one factory interface robot 538 to facilitate the transfer of substrates 521, such as the substrate 202. The at least one docking station 507 is configured to accept one or more front opening unified pod (FOUP). Four FOUPS, identified as 505A, 505B, 505C, and 505D, are shown in FIG. 5. The at least one factory interface robot 538 is configured to transfer the substrates 521 from the factory interface 504 to the processing platform 501 through the load lock chambers 506A, 5066. Each of the load lock chambers 506A and 506B have a first port coupled to the factory interface 504 and a second port coupled to the transfer chamber 503. The load lock chambers 506A and 506B are coupled to a pressure control system (not shown) which pumps down and vents the load lock chambers 506A and 506B to facilitate passing the substrates between the vacuum environment of the transfer chamber 503 and the substantially ambient (e.g., atmospheric) environment of the factory interface 504.

The transfer chamber 503 has a vacuum robot 542 disposed therein. The vacuum robot 542 is capable of transferring the substrates 521 between the load lock chamber 506A and 506B and the processing chambers 514A, 514B, 514C, and 514D. In some embodiments, the vacuum robot 542 includes one or more upper arms that are rotatable about a respective shoulder axis. In some embodiments, the one or more upper arms are coupled to respective forearm and wrist members such that the vacuum robot 542 can extend into and retract from any processing chambers coupled to the transfer chamber 503.

The processing chambers 514A, 514B, 514C, and 514D, are coupled to the transfer chamber 503. Each of the processing chambers 514A, 514B, 514C, and 514D may comprise a chemical vapor deposition (CVD) chamber, an atomic layer deposition (ALD) chamber, a physical vapor deposition (PVD) chamber, a plasma enhanced atomic layer deposition (PEALD) chamber, and etch chamber (i.e., dry etch chamber) a preclean/annealing chamber, or the like. In some embodiments, the processing chambers 514A, 514B, 514C, and 514D comprise at least one PVD chamber configured to deposit the seed layer 302 and at least one CVD chamber configured to deposit the bulk layer 410.

A system controller 502 controls the operation of the multi-chamber processing tool 500 using a direct control of the process chambers 514A, 514B, 514C, and 514D or alternatively, by controlling the computers (or controllers) associated with the process chambers 514A, 514B, 514C, and 514D. The system controller 502 generally includes a central processing unit (CPU) 530, a memory 534, and a support circuit 532. The CPU 530 may be one of any form of a general-purpose computer processor that can be used in an industrial setting. The support circuit 532 is conventionally coupled to the CPU 530 and may comprise a cache, clock circuits, input/output subsystems, power supplies, and the like. Software routines, such as processing methods as described above may be stored in the memory 534 and, when executed by the CPU 530, transform the CPU 530 into a system controller 502. The software routines may also be stored and/or executed by a second controller (not shown) that is located remotely from the multi-chamber processing tool 500.

In operation, the system controller 502 enables data collection and feedback from the respective chambers and systems to optimize performance of the multi-chamber processing tool 500 and provides instructions to system components. For example, the memory 534 can be a non-transitory computer readable storage medium having instructions that when executed by the CPU 530 (or system controller 502) perform the methods described herein.

The terms "about" or "approximately" used herein may be within any suitable range, for example, within 10%. While the foregoing is directed to embodiments of the present disclosure, other and further embodiments of the disclosure may be devised without departing from the basic scope thereof.

The invention claimed is:

1. A method of depositing tungsten in features of a substrate, comprising:
depositing a seed layer comprising 95 percent or greater of tungsten in the features via a physical vapor deposition (PVD) process, wherein the PVD process is performed at a chamber pressure of about 0.1 to about 10 mTorr; and
depositing a bulk layer consisting essentially of tungsten in the features via a chemical vapor deposition (CVD) process to fill the features, wherein substantially all of the deposition of the bulk layer is in the features as compared to a field region of the substrate, wherein the CVD process is performed at a chamber pressure of about 1 to about 300 Torr, and wherein the CVD process is performed by:
flowing a first gas comprising hydrogen gas ($H_2$) only at a first flow rate of about 25 to about 75 sccm;
flowing a tungsten precursor at a second flow rate of about 100 to about 1000 sccm, wherein the first flow rate is less than the second flow rate; and
flowing argon gas at a third flow rate of about 3000 to about 7000 sccm, wherein the third flow rate is about 4 to about 20 times greater than the second flow rate.

2. The method of claim 1, wherein the tungsten precursor is a tungsten halide.

3. The method of claim 1, wherein the filled features do not include nitrogen.

4. The method of claim 1, wherein the CVD process is a non-plasma CVD process.

5. The method of claim 1, wherein a tungsten concentration in the bulk layer is less than a tungsten concentration in the seed layer.

6. The method of claim 1, wherein the PVD process and the CVD process are performed at a temperature of about 200 to about 500 degrees Celsius.

7. The method of claim 1, wherein
the second flow rate is about 400 to about 600 sccm.

8. The method of claim 1, wherein the PVD process and the CVD process are performed in a common multi-chamber processing tool.

9. The method of claim 1, wherein at least one of:
the CVD process is performed after the PVD process without an intermediate passivation process, or
the CVD process is performed after the PVD process without etching an overhang of the substrate.

10. A non-transitory computer readable medium having instructions stored thereon that, when executed by one or more processors, cause the one or more processors to perform the method of claim 1.

11. The non-transitory computer readable medium of claim 10, further comprising flowing an inert gas during the CVD process at a third flow rate of about 3000 sccm to about 7000 sccm.

12. The method of claim 1, wherein the CVD process is a superconformal CVD process.

* * * * *